United States Patent [19]

Ohmori et al.

[11] Patent Number: 5,187,118
[45] Date of Patent: Feb. 16, 1993

[54] METHOD OF MANUFACTURING SEMICONDUCTOR DEVICES

[75] Inventors: Masashi Ohmori; Youichi Midou, both of Itami, Japan

[73] Assignee: Mitsubishi Denki Kabushiki Kaisha, Tokyo, Japan

[21] Appl. No.: 570,828

[22] Filed: Aug. 22, 1990

[30] Foreign Application Priority Data

Oct. 5, 1989 [JP] Japan .................. 1-260635
Jun. 8, 1990 [JP] Japan .................. 2-148653

[51] Int. Cl.$^5$ ......................... H01L 21/44
[52] U.S. Cl. ..................... 437/180; 437/228
[58] Field of Search ............ 437/180, 228, 245, 250, 437/935, 946; 148/DIG. 28; 250/566, 568; 235/462, 375

[56] References Cited

U.S. PATENT DOCUMENTS 4,896,034  1/1990  Kiriseko .................. 250/271
4,930,086  5/1990  Fukasawa ................ 235/375

FOREIGN PATENT DOCUMENTS 0235454 of 1985 Japan .

Primary Examiner—Brian E. Hearn
Assistant Examiner—Tuan Nguyen
Attorney, Agent, or Firm—Leydig, Voit & Mayer

[57] ABSTRACT

In a method of manufacturing semiconductor devices by using a semiconductor wafer having a circuit area in which a circuit pattern is to be formed and a character printing area in which a lot number pattern for recording characters used for product management is to be formed, etching the surface of the semiconductor wafer to form the lot number pattern in the character printing area, forming a metallic layer over the surface of the semiconductor wafer, and selectively removing the portion of the metallic layer located on the circuit area but not used as the circuit pattern and the portion of the metallic layer located on the character printing area simultaneously.

9 Claims, 10 Drawing Sheets

FIG. IA
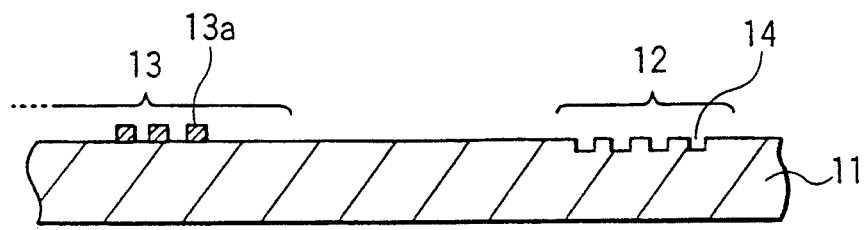
FIG. IB
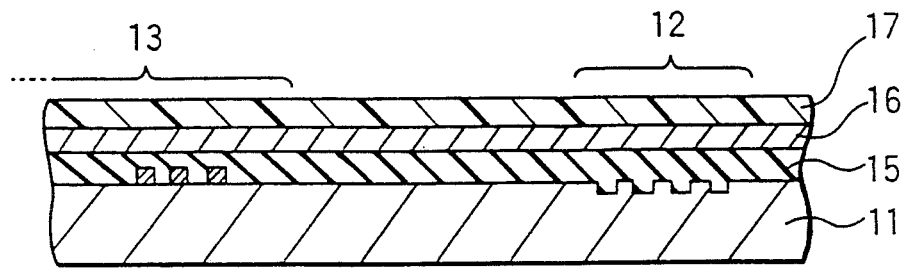
FIG. IC
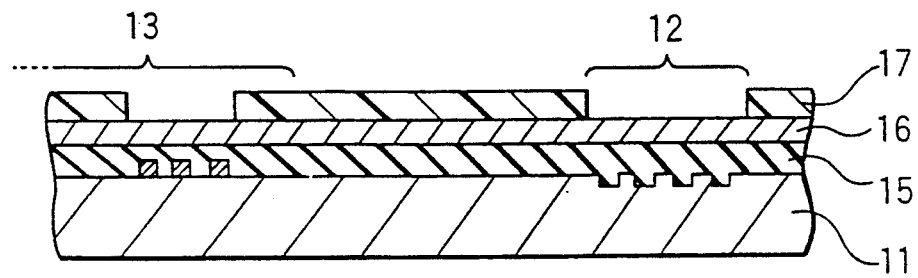
FIG. ID
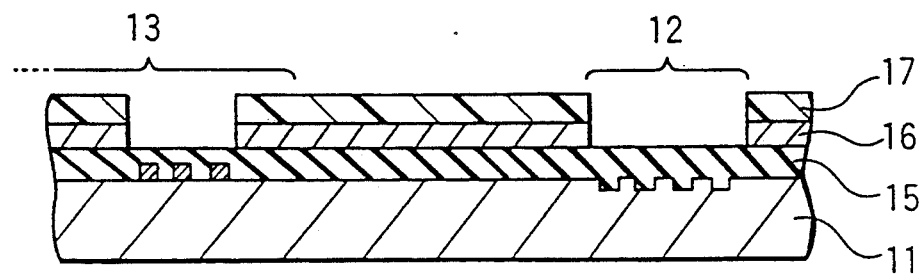

FIG. 8A
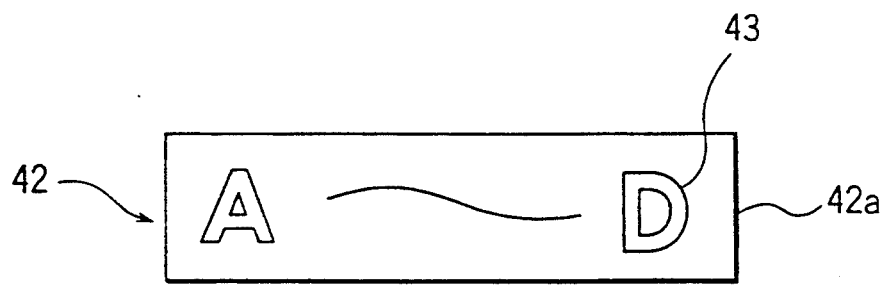
FIG. 8B   FIG. 8C   FIG. 8D
   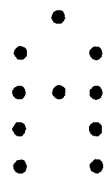   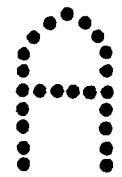

METHOD OF MANUFACTURING SEMICONDUCTOR DEVICES

BACKGROUND OF THE INVENTION

1. Field of the Invention

This invention relates to a method of manufacturing semiconductor devices and, more particularly, to a method of writing lot numbers used for product management on semiconductor substrates.

2. Description of the Related Art

Recently, the density of active and passive elements integrated on a semiconductor substrate to form semiconductor circuits has remarkably increased. Correspondingly, the structure of circuits formed on the surface of a semiconductor wafer (hereinafter referred to simply as a "wafer") is extremely complicated. For example, in a planar process, a wafer is exposed to an oxidizing atmosphere at a high temperature to form an $SiO_2$ layer having a uniform thickness on the surface of the wafer. This $SiO_2$ layer has masking effects with respect to the diffusion of donor or acceptor impurity atoms. This layer is precisely processed by the photo-etching technique. This process is repeated a number of times to form an integrated multilayer semiconductor circuit.

In the process of manufacturing semiconductor substrates on which integrated circuits are formed in this manner, before the formation of circuit patterns, lot numbers are assigned to regions separate from the regions in which the circuit patterns are formed. The lot numbers are read by an optical means for management of the characteristics of products, the number of products and so on.

A conventional method of printing lot numbers and a relating printing structure will be described below.

Referring to FIG. 10, a character printing area 2 in which a lot number is to be printed and a circuit area 3 in which circuit patterns are to be formed are placed on a wafer 1. A predetermined lot number pattern 4 such as that shown in FIG. 11 is formed in the character printing area 2. Thereafter, an insulating layer 5 such as a polysilicon layer is formed over the whole surface of the wafer 1, and a metallic layer 6 such as an Al layer is formed on the insulating layer 5 as shown in FIG. 12, thereby enabling an integrated multilayer semiconductor circuit to be formed. In FIG. 12, only one insulating layer 5 and only one metallic layer 6 are formed, but several insulating layers and as many as several tens of metallic layers are formed in an actual process.

The character printing area 2 in which the lot number pattern 4 is formed is placed in a region to avoid interference with the circuit area 3 for the wafer 1. For example, as shown in FIG. 10, the character printing area 2 is placed opposite to the orientation flat 1a of the wafer 1 or in the vicinity of the orientation flat 1a.

FIG. 13 schematically shows an apparatus for printing lot numbers and for forming circuit patterns. First, in a resist application unit 7, a resist is applied to the surface of the wafer 1. Next, the wafer 1 is thereafter moved as indicated by the broken line in FIG. 13 to expose the circuit area 3 in a mask aligner 8, and to expose the character printing area 2 in a printing exposure unit 9. Thereafter, both the areas 2 and 3 are simultaneously developed in a development unit 10. The resist in the areas 2 and 3 is removed so as to expose the wafer 1. Then etching erodes portions of the wafer 1 corresponding to circuit pattern portions and lot number pattern portions, thereby forming recesses of the circuit pattern and the lot number pattern.

Thereafter, process steps of forming a metallic layer, applying the resist, exposure, development, etching and so on are repeated to form a plurality of layers of circuit patterns.

In this process, lot number patterns 4 etched as described above are read from the wafers 1 by an optical means for lot recognition.

However, circuit pattern lamination after etching patterns in the wafer 1 is effected over the whole surface of the wafer 1 including the character printing area 2 without being limited to the circuit area 3. That is, an undesirable layer is formed over the lot number pattern 4 which has already been formed suitably by the first etching. For this reason, a signal $S_1$ obtained by reading the encoded lot number pattern 4a along the line B—B with an optical sensor of a printed code reader (not shown) has a large variation in level, as shown in FIG. 14. In FIG. 14, Vf represents the full scale.

This may be because extraneous materials are formed by chemical reaction at the interface between the metallic layer and the insulating layer, and cause irregular reflection at the time of reading with the optical sensor, adding noise components to the read signal $S_1$. The accuracy in reading the lot number pattern 4a is therefore reduced.

As described above, the conventional process entails a problem in that irregular reflection is caused by extraneous materials existing at a layer interface in the character printing area 2, and noise components are thereby added to the read signal $S_1$, resulting in a reduction in lot number reading accuracy and, hence, difficulty in correctly conducting product management.

SUMMARY OF THE INVENTION

The present invention has been achieved to solve the above-described problem, and an object of the present invention is to provide a semiconductor manufacture method in which lot numbers can be read with improved accuracy.

To this end, the present invention provides a semiconductor device manufacture method including the steps of: preparing a semiconductor wafer having a circuit area in which a circuit pattern is to be formed and a character printing area in which a lot number pattern is to be formed; etching a surface of the semiconductor wafer to form the lot number pattern in the character printing area; forming a metallic layer on the whole of the surface of the semiconductor wafer; and selectively and simultaneously removing a portion of the metallic layer located on the circuit area but not used as the circuit pattern, and another portion of the metallic layer located on the character printing area.

BRIEF DESCRIPTION OF THE DRAWINGS

FIGS. 1A to 1D are cross-sectional views of a sequence of steps of a process for manufacturing semiconductor devices in accordance with one embodiment of the present invention;

FIG. 8A is a plan view of the construction of a character printing area in accordance with still another embodiment of the present invention;

FIGS. 8B to 8D are diagrams of modified examples of the character print;

DESCRIPTION OF THE PREFERRED EMBODIMENTS

Embodiments of the present invention will be described below with reference to the accompanying drawings.

Referring to FIG. 1A, a character printing area 12 in which a lot number is to be printed and a circuit area 13 in which circuit patterns are to be formed are placed on a semiconductor wafer 11. A predetermined lot number pattern 14 is printed by etching the surface of the character printing area 12.

Figure 13:
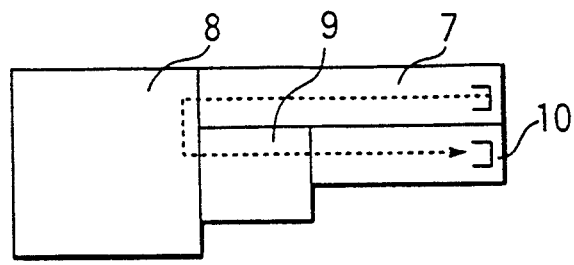
FIG. 13 is a schematic diagram of the construction of an apparatus for forming character printing patterns and circuit patterns.
Figure 14:
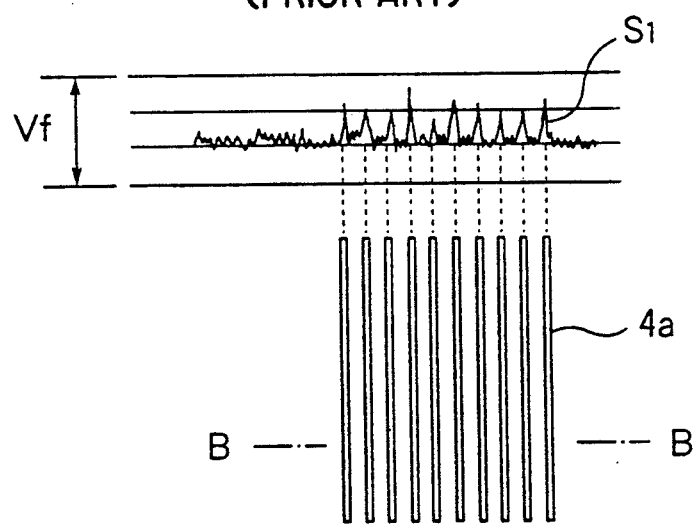
FIG. 14 is a diagram of a lot number pattern of the conventional semiconductor device and a signal obtained by reading this pattern.

A manufacturing apparatus similar to that shown in FIG. 13 is used for printing the lot number pattern 14. That is, in a resist application unit 7, a resist is applied to the surface of the wafer 11. Next, the wafer 11 is processed in a mask aligner 8 and in a printing exposure unit 9 for exposure of the circuit area 13 and the character printing area 12, respectively. Thereafter, both the areas 12 and 13 are simultaneously developed in a development unit 10. The resist in the areas 12 and 13 is removed to so as to expose the wafer 11. Then etching erodes portions of the wafer 11 corresponding to circuit pattern portions and lot number pattern portions, thereby forming recesses of the circuit pattern and the lot number pattern 14.

Thereafter, metallic patterns 13a are formed at desired positions in the circuit area 13 of the wafer 11.

Then, as shown in FIG. 1B, an insulating layer 15 such as a polysilicon layer and a metallic layer 16 such as an Al layer are successively formed on the whole surface of the wafer 11, and resist 17 is applied to the surface of the metallic layer 16 by using the resist application unit 7 again. The part of the resist 17 located on the circuit area 13 and on portions of the metallic layer 16 other than the portions of the same which are to be left to form a circuit pattern, i.e., the part of the resist 17 corresponding to the unnecessary portions of the metallic layer 16, is exposed by the mask aligner 8, and the part of the resist 17 on the character printing area 12 is exposed in the printing exposure unit 9. The part of the resist 17 thereby exposed is removed by development in the development unit 10, as shown in FIG. 1C.

Next, the metallic layer 16 is etched through the mask formed of the resist 17. The unnecessary portions of the metallic layer 16 on the circuit area 13 and the metallic layer 16 on the character printing area 12 are thereby selectively removed as shown in FIG. 1D. The remaining resist 17 is then removed.

Thereafter, process steps of forming a metallic layer, applying the resist, exposure, development, etching of the metallic layer and so on are repeated to form a plurality of layers of circuit patterns.

In this process, the metallic layer portion on the character printing area 12 is removed each time that a metallic layer on the circuit area 13 is etched.

Figure 2:
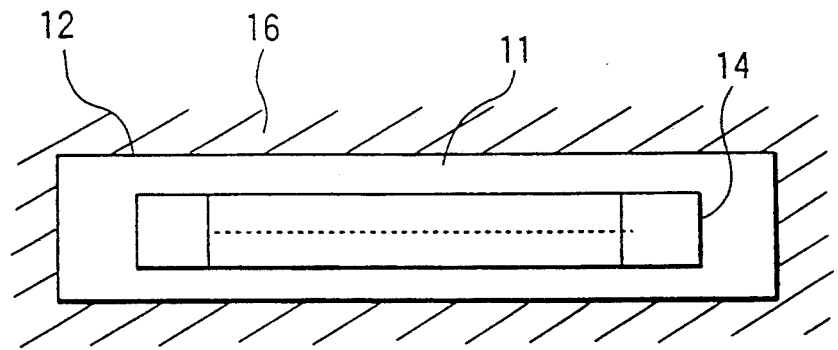
FIGS. 2 and 3 are a plan view and a cross-sectional view, respectively, of a character printing area of a semiconductor device manufactured in accordance with the embodiment of FIG. 1D; of FIG. 1D
Figure 3:
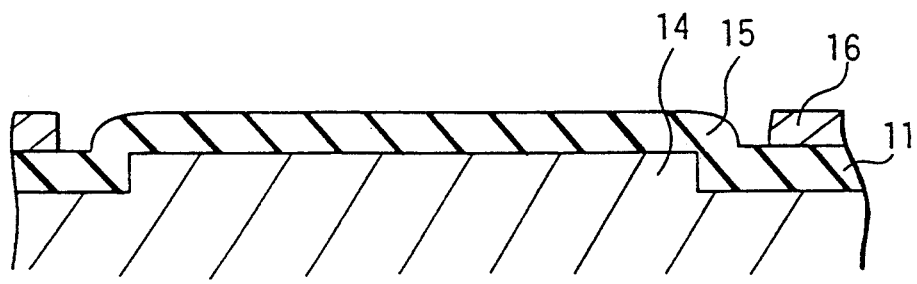
Figure 4:
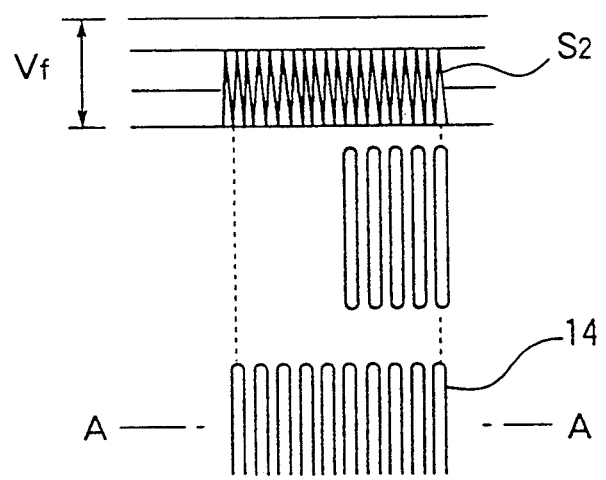
FIG. 4 is a diagram of a lot number pattern in accordance with the embodiment of FIG. 1D and a signal obtained by reading this pattern.

There is therefore no possibility of accumulating metallic layers in the character printing area 12, as shown in FIGS. 2 and 3. Consequently, when the lot number pattern 14 is read with an optical sensor of a printing code reader (not shown), it is possible to prevent the addition of noise components to the read signal owing to irregular reflection of light caused by extraneous materials produced at the interface between metallic layers and insulating layers. In a case where a signal $S_2$ is obtained by reading the encoded lot number pattern 14 along the line A—A as shown in FIG. 4, the signal S2 can represent the lot number pattern 14 accurately. In FIG. 4, Vf represents the full scale.

Figure 5A:
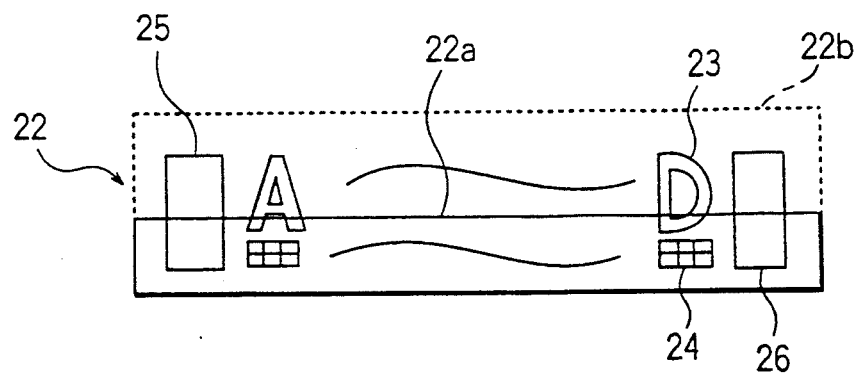
FIG. 5A is a plan view of the construction of a printing area in accordance with the embodiment.

An example of the lot number pattern used in accordance with the present invention will be described below. FIG. 5A shows the construction of a character printing area 22 in which a character print 23 to be read visually by an operator and a code print 24 to be read with the printed code reader (not shown) are printed. A start bit 25 and an end bit 26 are formed at the ends of the character printing area 22 to facilitate the search for the code print 24. In this example, an area 22a from which the metallic film is removed is smaller than the character printing area 22, and portions of the start and end bits 25 and 26 and the code print 24 are formed in the area 22a.

Figure 5B:
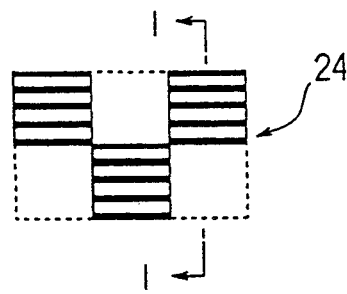
FIG. 5B is an enlarged diagram of the code print shown in FIG. 5A.
Figure 5C:
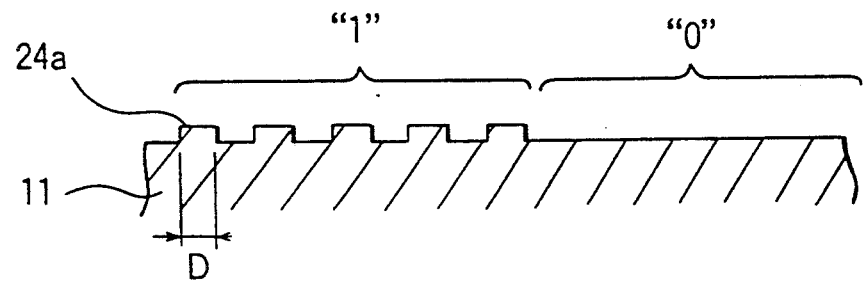
FIG. 5C is a cross-sectional view taken along the line I—I of FIG. 5B.

The contents of the code print 24 are formed based on 0:1 bit information units, as shown in FIG. 5B; English characters, numerals and other characters are expressed as 16 characters (4-bit construction), 64 characters (6-bit construction), 256 characters (8-bit construction) according to the number of bits of each character. In the example shown in FIG. 5B, the code print 24 has a 6-bit construction. For each bit information item, as shown in FIG. 5C, a plurality of print projections 24a or a flat surface is formed in a predetermined region of the surface of the wafer 11 to represent "1" or "0". The width D of each projection is, for example, 5 to 25 μm.

Figure 6:
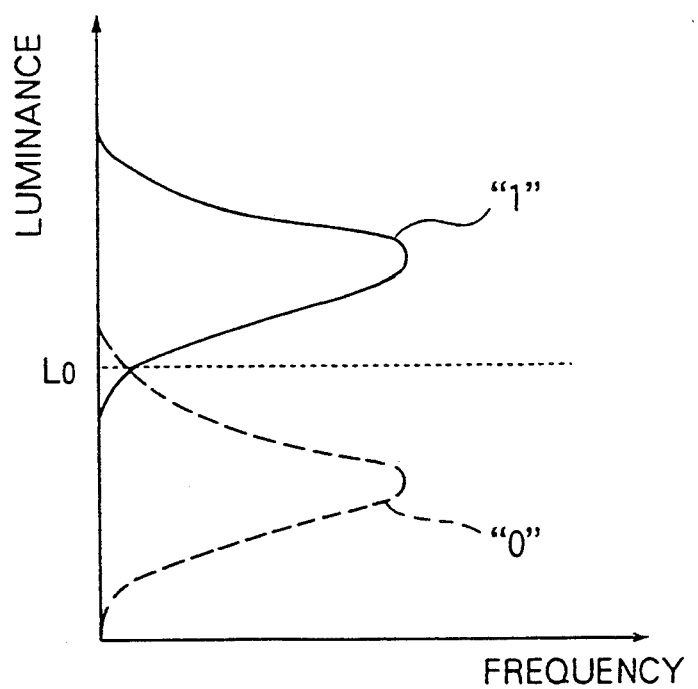
FIG. 6 is a diagram of the luminance distribution of a code print reading signal.

To read such bit information, the code print 24 is irradiated with light, and primary diffracted light is detected for each information bit to obtain the corresponding luminance distribution. If the luminance at the peak of the distribution exceeds a threshold $L_0$ as shown in FIG. 6, the information bit is determined to be a "1", or, if the peak luminance is smaller than $L_0$, the information item is determined to be a "0".

It is desirable to determine the size of the metallic layer removal area 22a so that length of this area is larger than the distance between and including the start and end bits 25 and 26 by about 0.1 to 0.5 mm while the width is larger than the distance between the end borders of the code print 24 by 0.1 to 0.5 mm also. Preferably, for ease of visually reading the lot number, the metallic layer removal area 22b may be increased in the widthwise direction so as to cover the overall width of the character printing area 22 or to fully contain the character print 23. In practice, however, it is determined in consideration of the relationship with the circuit area.

Figure 7A:
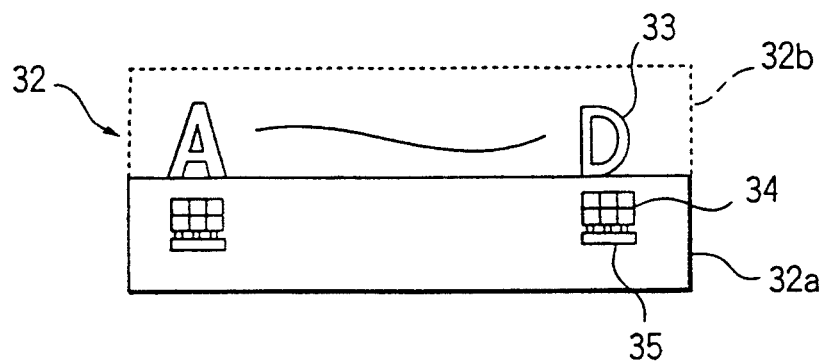
FIG. 7A is a plan view of the construction of a character printing area in accordance with another embodiment of the present invention.
Figure 7B:
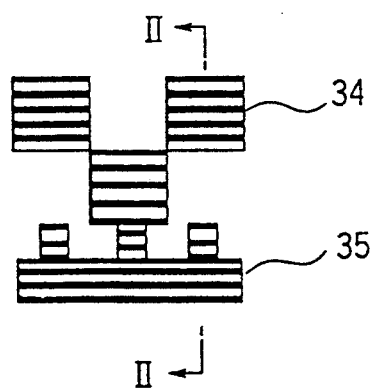
FIG. 7B is an enlarged diagram of the code print and a discriminator shown in FIG. 7A.
Figure 7C:
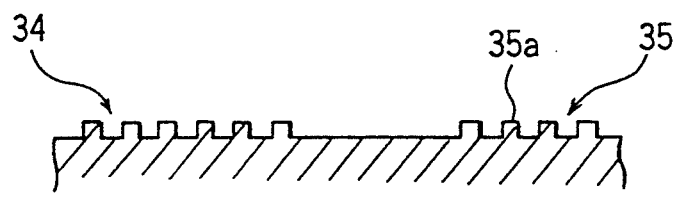
FIG. 7C is a cross-sectional view taken along the line II—II of FIG. 7B.

Referring to FIG. 7A, a discriminator 35 for searching for a code print 34 may be formed in the vicinity of the code print 34 instead of using the start bit and the end bit. The discriminator 35 is formed of a plurality of print projections 35a as in the case of the information bit of the code print 34 representing "1", as shown in FIGS. 7B and 7C. In this case also, it is desirable to extend a metallic layer removal area 32a beyond the end borders of the code print 34 in the longitudinal direction and beyond the end borders of the code print 34 including the discriminator 35 in the widthwise direction by about 0.1 to 0.5 mm. It is also preferable to increase the metallic layer removal area 32b in the widthwise direction so as to cover the overall width of a character printing area 32 or to fully contain a character print 33.

Referring to FIG. 8A, only a character print 43 may be formed in a character printing area 42 without using any code print. To read the lot number, lot recognition is effected by directly reading the character print 43 with a reader (not shown). In this case, it is desirable to define a metallic layer removal area 42a by extending the same beyond the borders or the character print 43 in the longitudinal and widthwise directions by 0.1 to 0.5 mm. The character print 43 may be formed as a stripe pattern such as that shown in FIG. 8B formed by an exposure process, or as a dot pattern such as that shown in FIGS. 8C or 8D formed by laser printing.

Figure 9A:
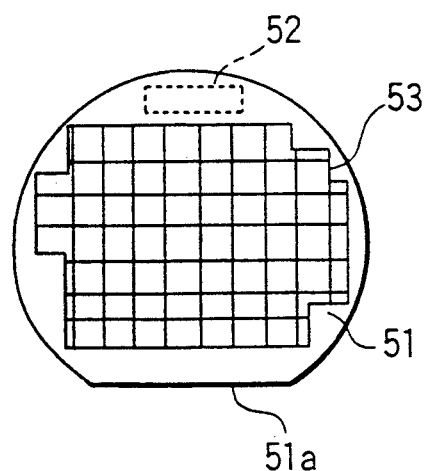
FIGS. 9A to 9D are plan views showing places in which character printing areas are set may be placed.
Figure 9B:
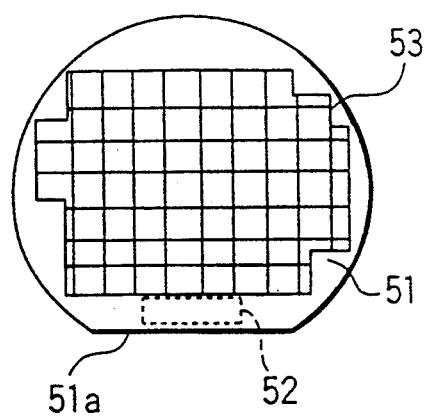
Figure 9C:
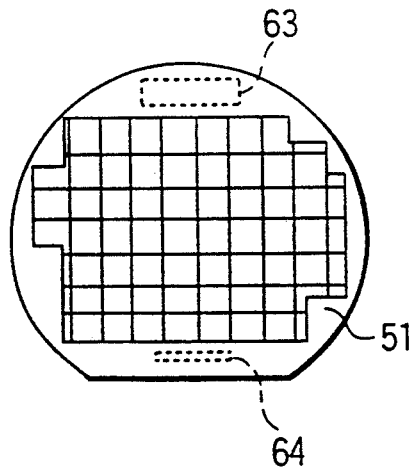
Figure 9D:
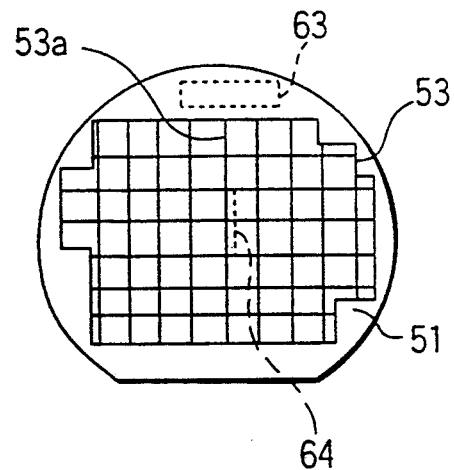
Figure 10:
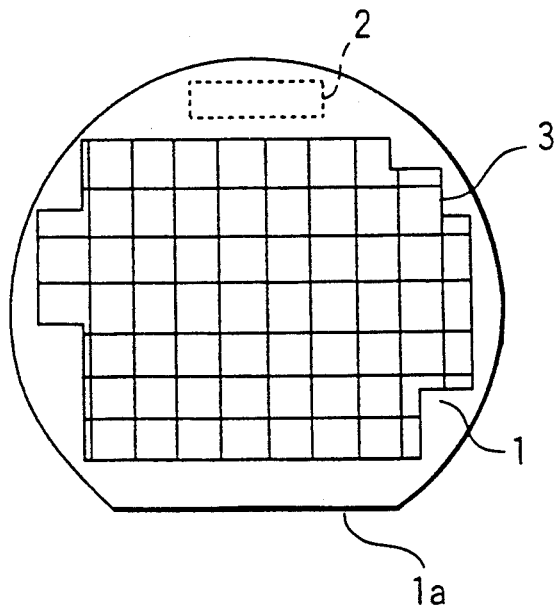
FIG. 10 is a plan view of the construction of a wafer.
Figure 11:
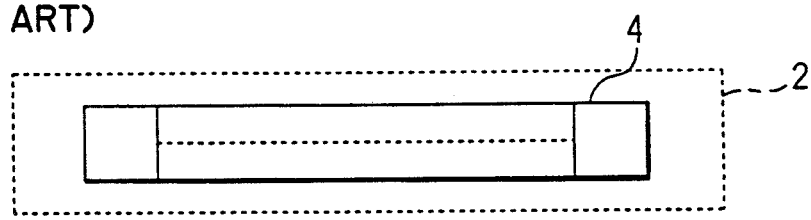
FIGS. 11 to 12 are a plan view and a cross-sectional views of character printing areas of a conventional semiconductor device.
Figure 12:
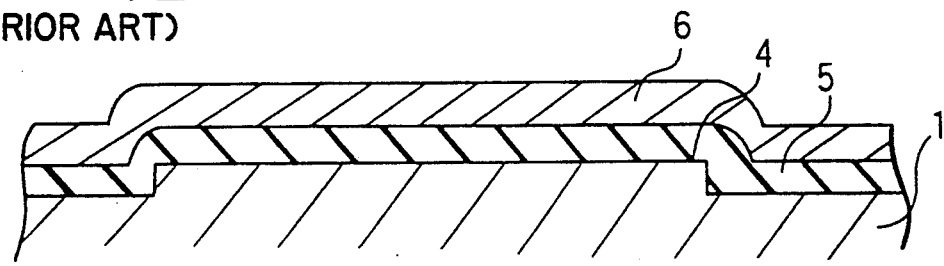

As shown in FIG. 9A, a character printing area 52 is set in a region to avoid interference with a circuit area 53, for example, in a position opposite to the orientation flat 51a of a wafer 51. Alternatively, it may be formed in the vicinity of the orientation flat 51a of the wafer 51, as shown in FIG. 9B. In a case where the lot number pattern includes both a character print and a code print, a character print 63 and a code print 64 may be formed in different places on a wafer 51, as shown in FIG. 9C. Further, in this case, the code print 64 may be placed on a dicing line 53a in a circuit area 53, as shown in FIG. 9D.

What is claimed is:

1. A method of manufacturing semiconductor devices comprising:
   preparing a semiconductor wafer having a circuit area in which a circuit pattern is to be formed and a character printing area in which a lot number pattern is to be formed;
   etching a surface of the semiconductor substrate to form the lot number pattern in the character printing area and forming a metallic layer on the whole of the surface of the semiconductor wafer; and
   forming a circuit pattern by sequentially depositing, patterning, and etching a plurality of metallic layers and insulating layers on the circuit area, including depositing each of the metallic layers and insulating layers on the character printing area wherein, while etching each metallic layer to remove undesired portions of that metallic layer from the circuit area, selectively and simultaneously removing that metallic layer from the character printing area whereby formation of material in the character printing area interfering with reading of the lot number pattern is avoided.

2. A method according to claim 1 wherein each step of removing portions of the metallic layers includes:
   applying a resist to the respective metallic layer;
   exposing and developing the resist to selectively remove the part of the resist located on the undesired portions of the respective metallic layer and from the character printing area;
   selectively removing the respective metallic layer not covered by the remaining resist; and
   removing the remaining resist.

3. A method according to claim 1 including, after the formation of the lot number pattern and before forming the circuit pattern, forming an insulating layer on the whole of the surface of the semiconductor wafer and subsequently forming the circuit pattern on the insulating layer.

4. A method according to claim 1 wherein the character printing area is outside and separate from the circuit area.

5. A method according to claim 1 wherein the lot number pattern includes a character and a code.

6. A method according to claim 5 including placing the character and the code adjacent each other.

7. A method according to claim 5 including placing the character and the code on opposite sides of the circuit pattern.

8. A method according to claim 7 including placing the code on a dicing line in the circuit area.

9. A method according to claim 1 wherein the lot number pattern consists of characters.

* * * * *